(12) United States Patent
Chung et al.

(10) Patent No.: US 9,991,112 B2
(45) Date of Patent: Jun. 5, 2018

(54) METHOD FOR FORMING DIELECTRIC FILM AND METHOD FOR FABRICATING SEMICONDUCTOR DEVICE

(71) Applicants: Won Woong Chung, Suwon-si (KR); Youn Joung Cho, Hwaseong-si (KR); Sun Hye Hwang, Hwaseong-si (KR)

(72) Inventors: Won Woong Chung, Suwon-si (KR); Youn Joung Cho, Hwaseong-si (KR); Sun Hye Hwang, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days. days.

(21) Appl. No.: 15/639,672

(22) Filed: Jun. 30, 2017

(65) Prior Publication Data

US 2018/0090313 A1 Mar. 29, 2018

(30) Foreign Application Priority Data

Sep. 28, 2016 (KR) ........................ 10-2016-0124464

(51) Int. Cl.
*H01L 21/02* (2006.01)
*H01L 21/31* (2006.01)
*C23C 16/34* (2006.01)
*C23C 16/455* (2006.01)
*H01L 21/28* (2006.01)

(52) U.S. Cl.
CPC ...... *H01L 21/02222* (2013.01); *C23C 16/345* (2013.01); *C23C 16/45553* (2013.01); *H01L 21/0217* (2013.01); *H01L 21/0228* (2013.01); *H01L 21/02164* (2013.01); *H01L 21/28282* (2013.01)

(58) Field of Classification Search
CPC .... H01L 21/3125; H01L 21/02208–21/02222; H01L 21/0217; H01L 21/0228; C23C 16/45553; C23C 16/345
See application file for complete search history.

(56) References Cited

U.S. PATENT DOCUMENTS

| | | | | |
|---|---|---|---|---|
| 4,540,803 | A | * 9/1985 | Cannady | C08G 77/62 264/176.1 |
| 4,868,014 | A | 9/1989 | Kanai et al. | |
| 5,233,066 | A | * 8/1993 | Jansen | C01B 21/064 528/5 |
| 5,424,095 | A | * 6/1995 | Clark | C23C 16/30 427/237 |
| 5,436,083 | A | * 7/1995 | Haluska | C04B 35/62222 257/632 |
| 5,453,527 | A | * 9/1995 | Baldus | C04B 35/581 423/327.1 |
| 7,772,097 | B2 | 8/2010 | Tomasini et al. | |
| 7,939,447 | B2 | 5/2011 | Bauer et al. | |
| 9,206,507 | B2 | 12/2015 | Lansalot-Matras et al. | |

(Continued)

*Primary Examiner* — Marvin Payen
*Assistant Examiner* — Jeremy Joy
(74) *Attorney, Agent, or Firm* — Volentine & Whitt, PLLC

(57) ABSTRACT

A method of forming a dielectric film includes providing a substrate in a chamber, and forming a silicon nitride film on the substrate using an atomic layer deposition (ALD) method in which a first gas including a silicon precursor containing hexachlorodisilazane (HCDZ) and a second gas containing a nitrogen ingredient are introduced into the chamber.

20 Claims, 16 Drawing Sheets

(56) References Cited

U.S. PATENT DOCUMENTS

| | | | |
|---|---|---|---|
| 9,245,740 B2* | 1/2016 | Jang | C07F 7/10 |
| 9,337,018 B2 | 5/2016 | Xiao et al. | |
| 2005/0158983 A1* | 7/2005 | Hoshi | C23C 16/345 438/623 |
| 2006/0022228 A1* | 2/2006 | Hoshi | C23C 16/345 257/288 |
| 2006/0084283 A1* | 4/2006 | Paranjpe | C23C 16/345 438/791 |
| 2006/0198958 A1* | 9/2006 | Dussarrat | C23C 16/345 427/255.394 |
| 2006/0286817 A1* | 12/2006 | Kato | C23C 16/345 438/791 |
| 2008/0026149 A1 | 1/2008 | Tomasini et al. | |
| 2012/0108079 A1* | 5/2012 | Mahajani | C23C 16/308 438/788 |
| 2014/0273528 A1* | 9/2014 | Niskanen | C23C 16/345 438/792 |
| 2014/0273530 A1* | 9/2014 | Nguyen | H01L 21/0217 438/792 |
| 2016/0079054 A1* | 3/2016 | Chen | H01L 21/0228 438/762 |

\* cited by examiner

METHOD FOR FORMING DIELECTRIC FILM AND METHOD FOR FABRICATING SEMICONDUCTOR DEVICE

This application claims priority from Korean Patent Application No. 10-2016-0124464 filed on Sep. 28, 2016 in the Korean Intellectual Property Office, the disclosure of which is hereby incorporated by reference in its entirety.

BACKGROUND

1. Technical Field

The inventive concept relates to a method of forming a dielectric film and to a method of fabricating a semiconductor device using the same.

2. Description of the Related Art

It becomes very difficult to manufacture semiconductor elements as the integration of semiconductor devices increases. In particular, it becomes very difficult to form a thin film, e.g., a silicon nitride film, of a semiconductor device so as to have good step coverage on a substrate.

Meanwhile, when forming a silicon nitride film through an atomic layer deposition (ALD) method using an organic silicon precursor such as BTBAS (Bis(Tertiary-Butylamine) Silane), although the step coverage may be improved, C and N ingredients contained in the organic silicon precursor may adversely impact the quality of the silicon nitride film.

SUMMARY

According to an example of the inventive concept, there is provided a method of fabricating a semiconductor device that includes the forming of a dielectric film by: providing a substrate in a chamber, and forming a silicon nitride film on the substrate by atomic layer deposition (ALD), wherein the forming of the silicon nitride film by ALD comprises introducing a first gas comprising hexachlorodisilazane (HCDZ) as a silicon precursor into the chamber and introducing a second gas containing nitrogen into the chamber.

According to the inventive concept, there is also provided a method of fabricating a semiconductor device, comprising: providing in a deposition chamber a substrate having formed thereon a structure defining a step, and forming a dielectric film structure comprising a first dielectric film of silicon nitride in-situ on the step by atomic layer deposition (ALD), wherein the forming of the first dielectric film of silicon nitride includes introducing hexachlorodisilazane (HCDZ) as a silicon precursor into the deposition chamber.

According to an example of the inventive concept, there is also provided a method of fabricating a semiconductor device, comprising: supporting a structure in a deposition chamber of an atomic layer deposition apparatus, and performing a plurality of cycles of an atomic layer deposition (ALD) process, each of the cycles including introducing into the deposition chamber first gas comprising hexachlorodisilazane (HCDZ) as a silicon precursor of a dielectric film, and introducing into the deposition chamber a nitriding gas comprising nitrogen as a nitrogen precursor of the dielectric film. Here, at least some of the HCDZ is adsorbed at a surface of the structure, and at least some of the second gas reacts with the HCDZ adsorbed at the surface of the structure to form an atomic level layer of a nitride on said surface.

As a result, a dielectric film comprising a nitride of a desired thickness is formed on the surface of the structure.

BRIEF DESCRIPTION OF THE DRAWINGS

The above and other examples and features of the inventive concept will become more apparent from the detail description of examples thereof that follows as made with reference to the attached drawings.

DETAILED DESCRIPTION

Unless otherwise specified, all terms used herein (including technical and scientific terms) have meanings that may be commonly understood by those of ordinary skill in the art to which this disclosure pertains. Moreover, unless the terms are clearly specifically defined, the terms are not intended to be interpreted in an overly idealized way.

Hereinafter, examples of a method of forming a silicon nitride film according to the inventive concept will be described with reference to the timing diagram of FIG. 1.

A silicon nitride film is formed in situ using an ALD method according to this example of the inventive concept. The atomic layer deposition (ALD) method includes a first step of supplying a first gas containing a silicon precursor, a second step of removing the non-reacted first gas using a first purge gas, a third step of forming a silicon nitride film of an atomic layer level by supplying a second gas containing a nitriding gas, and a fourth step of removing the non-reacted second gas using a second purge gas.

Figure 1:
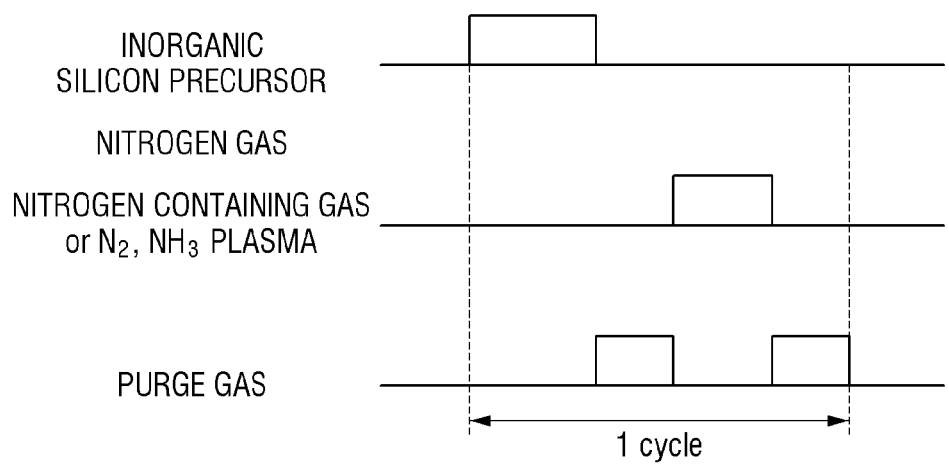
FIG. 1 is a timing diagram illustrating a method of forming a silicon nitride film according to some examples of the inventive concept.

Specifically, referring to FIG. 1, first, an object (specifically, a structure defining an opening or step on a substrate) to be coated with a silicon nitride film is located within a reaction chamber. In this case, an aspect ratio of the structure (ratio of a height to a width of an opening defined by the structure) may be equal to or greater than 10. However, the inventive concept is not limited thereto.

Subsequently, after appropriate adjustment of the temperature and pressure, the first gas containing the silicon precursor is supplied into the chamber. Then, the silicon precursor is adsorbed onto the structure.

Here, the silicon precursor may be a compound that does not contain C and N, unlike a conventional organic silicon precursor. However, the inventive concept is not limited thereto. That is, in some other examples, the silicon precursor may contain C.

The silicon precursor comprises HCDZ (hexachlorodisilazane) (Chemical Formula 1).

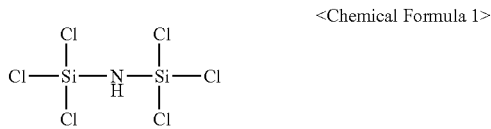
<Chemical Formula 1>

When using HCDZ as the silicon precursor, the wet etch rate (WER) may be lower compared to the case of using HCDS (hexachlorodisilane) as the silicon precursor. Here, WER means an etching rate of the film in hydrofluoric acid (HF) that is diluted, i.e., a solution of hydrofluoric acid (HF) and DI water. That is, the silicon nitride film produced using HCDZ as the silicon precursor has a relatively low etching rate compared to a silicon nitride film produced using the HCDS as the silicon precursor.

Thus, the silicon nitride film produced using the HCDZ as the silicon precursor may have the same quality as the silicon nitride film produced using HCDS of a relatively small thickness as the silicon precursor.

As a result, when forming the silicon nitride film using HCDZ as the silicon precursor according to the inventive concept, the process time is relatively short compared to the case of forming the silicon nitride film using the existing HCDS as the silicon precursor, thereby making it possible to improve the process efficiency.

Next, the first purge gas, e.g., $N_2$, He or Ar, is supplied into the chamber to remove the silicon source precursor that remains in the chamber (or does not react). Then, the silicon precursor is adsorbed by the structure to the atomic layer level.

Subsequently, a nitriding gas containing nitrogen ingredient is supplied into the chamber to form a silicon nitride film. Here, the nitriding gas may contain at least one of nitrogen ($N_2$), ammonia ($NH_3$) and nitrogen monoxide (NO). However, the inventive concept is not limited thereto.

Next, the second purge gas, e.g., $N_2$, He or Ar, is supplied into the chamber to remove nitriding gas remaining in the chamber. At this time, one cycle of the silicon nitride film formation process is complete and thus, the silicon nitride film of the atomic layer level is formed on the object.

Subsequently, by repeating the aforementioned processes, a silicon nitride film of a desired or appropriate thickness may be formed on the object.

Subsequently, in order to improve the film quality of the silicon nitride film, the silicon nitride film is subjected to heat treatment. Here, the heat treatment may be performed at 850° C. to 1050° C., for example (i.e., about the same temperature as forming a nitride film by chemical vapor deposition (CVD)). However, the inventive concept is not limited thereto.

The silicon nitride film thus formed may have an improved film quality as compared to a silicon nitride film formed by CVD. Because the silicon nitride film formed according to the inventive concept has excellent step coverage, the silicon nitride film may be conformally formed on a structure having a step or a structure having a large aspect ratio without voids.

The inventive concept will be disclosed further through concrete experimental examples described below, although certain details which will be readily understood and appreciated by those skilled in the art will be omitted for the sake of brevity.

Figure 2:
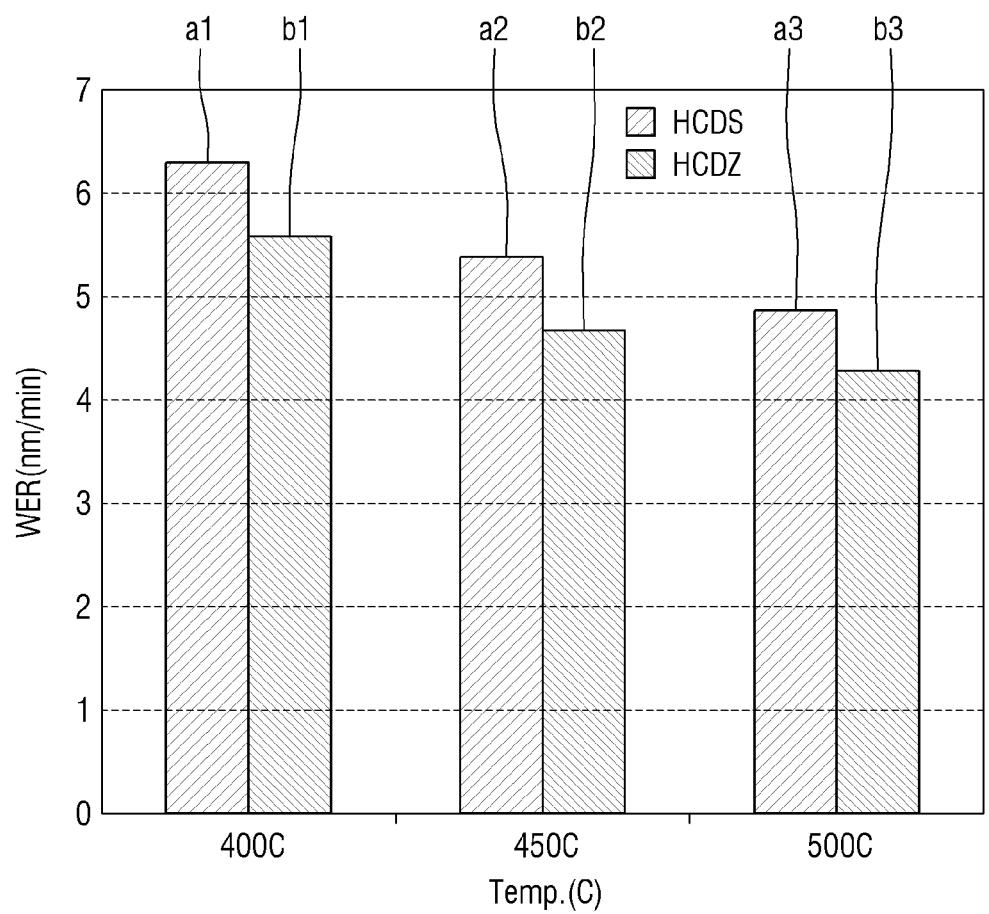
FIG. 2 and FIG. 3 are bar graphs for explaining experiment examples relating to the formation of the silicon nitride film according to some examples of the inventive concept.
Figure 3:
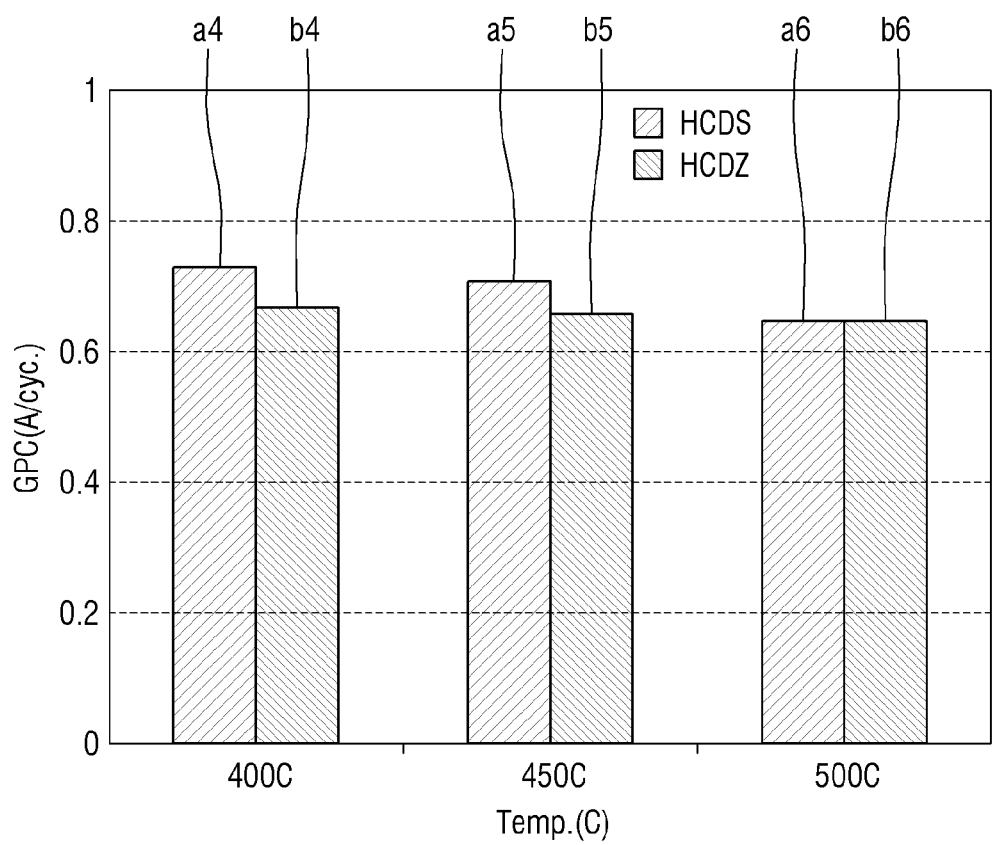

FIG. 2 and FIG. 3 show results of the forming of a silicon nitride film according to the inventive concept and results of the forming of a silicon nitride film of a comparative example by a technique different than that of the inventive concept.

Experimental Example—WER Measurements According to Process Temperature of HCDZ and HCDS Experiments whose results are shown in FIGS. 2 and 3 were performed as follows.

Silicon nitride films were formed by an ALD method using HCDZ. Meanwhile, a comparative example of a silicon nitride film was formed by a similar ALD method using HCDS.

More specifically, referring to FIG. 2, experimental examples of silicon nitride films were formed by ALD utilizing HCDZ at each process temperature of 400° C., 450° C. and 500° C., and comparative examples of silicon nitride films were formed by ALD utilizing HCDS at each process temperature of 400° C., 450° C. and 500° C.

Bar graphs (bars) a1, a2 and a3 illustrate the wet etch rate (WER) at the time of forming the comparative examples of the silicon nitride film formed using HCDS at each process temperature of 400° C., 450° C. and 500° C. Furthermore, bar graphs (bars) b1, b2 and b3 illustrate the WER of the experimental examples of the silicon nitride film formed using HCDZ at each process temperature of 400° C., 450° C. and 500° C. The WER illustrated in FIG. 2 was the etching rate of the films in hydrofluoric acid (HF) diluted with DI water at a ratio of 200:1.

Referring to the bar graphs a1 and b1 of the graph of FIG. 2, the WER was lower in the case of forming the silicon nitride film at 400° C. using HCDZ (the experimental example) than in the case of using HCDS (the comparative example).

Furthermore, referring to the bar graphs a2 and b2, the WER was lower in the case of forming a silicon nitride film at 450° C. using HCDZ (the experimental example) than when using HCDS (the comparative example).

Furthermore, referring to bar graphs a3 and b3, the WER was lower in the case of forming a silicon nitride film at 500° C. using HCDZ (the experimental example) than when using HCDS (the comparative example).

Specifically, as illustrated in FIG. 2, when using HCDS at 500° C., the WER was greater than 4.5 nm/min. and approximately 4.9 nm/min. On the other hand, when using HCDZ at 500° C., the WER was less than 4.5 nm/min. and was approximately 4.2 nm/min.

Accordingly, the experiments show that a silicon nitride film may be formed using HCDZ according to the inventive concept so that its WER is less than 4.5 nm/min. Also, in all cases the WER is lower when using HCDZ than when using HCDS under the same process (temperature) conditions. Thus, it is possible to form a silicon nitride film of a relatively small thickness but of the same quality as a silicon nitride film produced utilizing the HCDS as the silicon precursor.

Experimental Example—GPC Measurement According to Process Temperatures of HCDZ and HCDS Experiments that produced the results shown in FIG. were performed as follows.

Regarding the experimental examples, silicon nitride films were formed by ALD using HCDZ. Meanwhile, for the comparative examples, silicon nitride films were formed by ALD using HCDS.

More specifically, referring to FIG. 3, silicon nitride films were formed utilizing HCDZ at each process temperature of 400° C., 450° C. and 500° C. (the experimental examples, and silicon nitride films were formed utilizing HCDS at each process temperature of 400° C., 450° C. and 500° C. (the comparative examples).

Bar graphs a4, a5 and a6 illustrate a growth per cycle (GPC) at the time of forming the silicon nitride film at each process temperature of 400° C., 450° C. and 500° C. utilizing HCDS (the comparative examples). Furthermore, bar graphs b4, b5, and b6 illustrate the GPC at the time of forming the silicon nitride film at each process temperature of 400° C., 450° C. and 500° C. utilizing HCDZ (the experimental examples).

The bar graphs a4 and b4 show that the GPC is lower in the case of utilizing HCDZ when forming a silicon nitride film at 400° C. than in the case of using HCDS.

Furthermore, bar graphs a5 and b5 show that the GPC is lower in the case of forming a silicon nitride film at 450° C. utilizing HCDZ than in the case of using HCDS.

However, referring to bar graphs a6 and b6, the GPC is substantially the same in the cases of forming a silicon nitride film at 500° C. utilizing HCDS and HCDZ.

To summarize, referring to FIG. 2 and FIG. 3, when forming a silicon nitride film at 500° C., the GPC is substantially the same regardless of whether HCDS or HCDZ is used, but the WER is lower in the case of utilizing HCDZ. That is, the experimental results show that by utilizing HCDZ, it is possible to form a silicon nitride film having excellent film quality characteristics during the same process time that it would take to form a silicon nitride film using HCDS. In other words, it is possible according to the inventive concept to reduce the process time for forming a silicon nitride film having certain high film quality and step coverage. Thus, the process efficiency can be improved by practicing the inventive concept.

An example of a method of fabricating a semiconductor device such as flash memory device according to the inventive concept will be described now in detail referring to FIG. 4 to FIG. 6.

Figure 4:
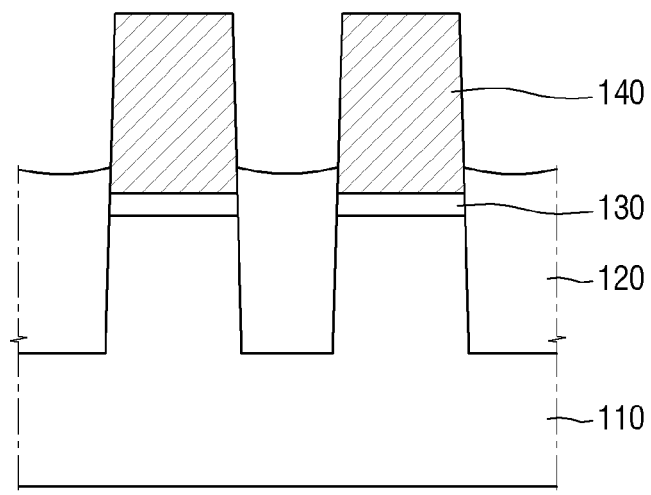
FIG. 4, FIG. 5 and FIG. 6 are cross-sectional views of a semiconductor device during the course of its manufacture and illustrate stages of an example of a method of fabricating a semiconductor according to the inventive concept.

Referring to FIG. 4, a tunnel insulating film 130 and a charge storage film 140 are sequentially formed on a substrate 110. The tunnel insulating film 130 provides an energy barrier against tunneling of charge and, for example, may include silicon oxide, silicon nitride or a high dielectric constant material (high-k material).

Examples of the high dielectric material may be metal oxides such as hafnium oxide, aluminum oxide, hafnium aluminum oxide and zirconium oxide, but the inventive concept is not limited thereto. Rather, the tunnel insulating film 130 may be formed of various materials in consideration of device requirement for energy bandgap as well as dielectric constant.

The charge storage film 140 serves to store the charge. Such a charge storage film may be formed of a conductive material such as polysilicon film, for example, when the flash memory device is a floating gate type. When the flash memory device is a charge trap type, the charge storage film may be formed of silicon nitride, hafnium oxide, zirconium oxide, tantalum oxide, hafnium oxynitride, hafnium silicon oxide, tungsten doped aluminum oxide, nanodots or the like.

Here, the forming of the tunnel insulating film 130 and the charge storage film 140 may include the sequential forming of a pre-tunnel insulating film, a pre-charge storage film and a mask on the substrate 110. An upper portion of the substrate 110, the pre-tunnel insulating film, the pre-charge storage film are then patterned using the mask as an etch mask, and the mask is removed. Next, an element isolation film 120 is formed on the substrate 120. However, the inventive concept is not limited thereto, i.e., the tunnel insulating film 130 and the charge storage film 140 may be formed by various other methods.

Figure 5:
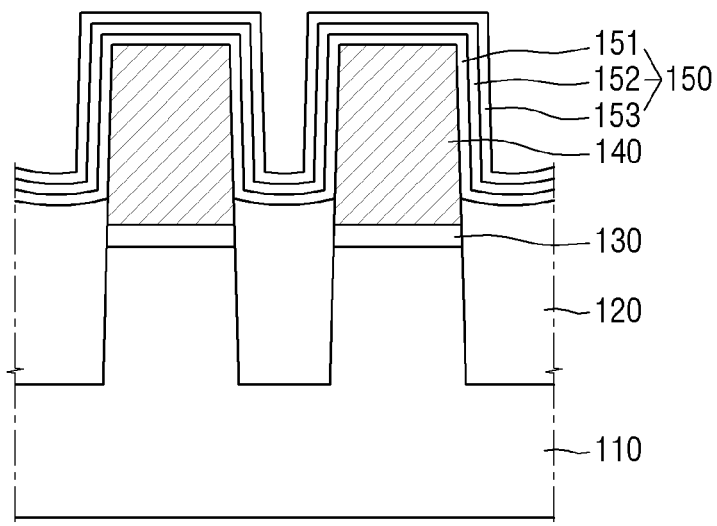
Figure 6:
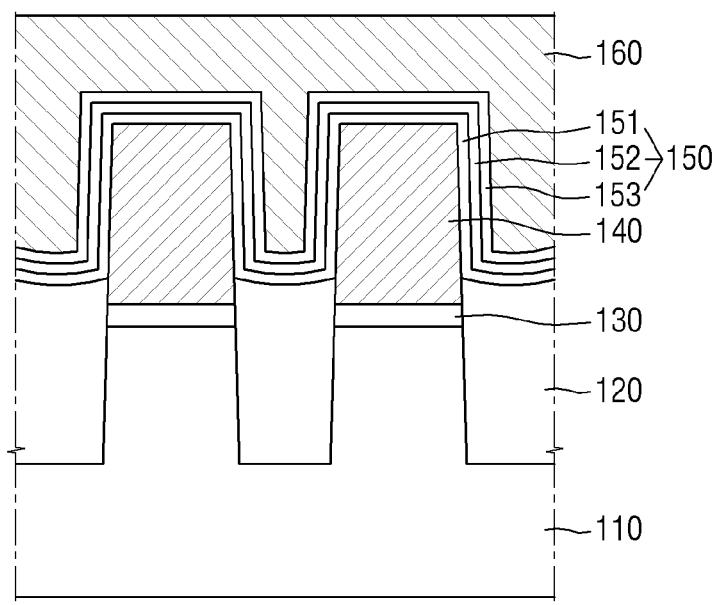

Referring to FIG. 5 and FIG. 6, a dielectric film structure 150, which includes a first dielectric film 151 formed of silicon oxide, a second dielectric film 152 formed of a material different from the silicon oxide, and a third dielectric film 153 formed of silicon oxide, are formed on the charge storage film 140, using an ALD method according to the inventive concept described above. Here, the dielectric film structure 150 may be an inter-gate dielectric film when the flash memory device is a floating gate type, and the dielectric film structure 150 may be a blocking dielectric film when the flash memory device is a charge trap type.

Hereinafter, a case of forming the dielectric film structure 150 in-situ, wherein the second dielectric film 152 is a silicon nitride film, will be described as an example.

First, the semiconductor substrate 110 having a step formed with the charge storage film 140 is supported in the reaction chamber of a deposition apparatus (refer back to the description of FIG. 1). Next, a first dielectric film 151 comprising silicon oxide is formed.

Subsequently, after adjusting the deposition apparatus to provide an appropriate temperature and pressure within the reaction chamber, a first gas containing a silicon source precursor is supplied into the chamber. Then, the silicon precursor is adsorbed onto the first dielectric film 151. HCDZ is utilized as the silicon source precursor, as described above.

Subsequently, as also described above, the first purge gas, the second gas and the second purge gas are sequentially supplied to form a silicon nitride film of an atomic layer level on the first dielectric film 151.

By repeating the above procedure, the second dielectric film 152, namely, a silicon nitride film of a desired thickness is formed on the first dielectric film 151.

Subsequently, a third dielectric film 153 comprising silicon oxide is formed on the second dielectric film 152.

Because the dielectric film structure 150 thus formed has the excellent step coverage, the dielectric film structure may be conformally formed without voids in the opening between the segments of the charge storage film 140 even when the opening has a large aspect ratio of, for example, 10 or more. Furthermore, because the first to third dielectric films 151, 152 and 153 are formed in situ, process time may be minimized and the overall manufacturing process may be simplified.

Next, a control gate 160 is formed on the dielectric film structure 150. The control gate 160 may be formed of polysilicon, for example, or may be formed of at least one metal electrode material selected from a group consisting of TaN, TiN, WN and W, for example.

Figure 7:
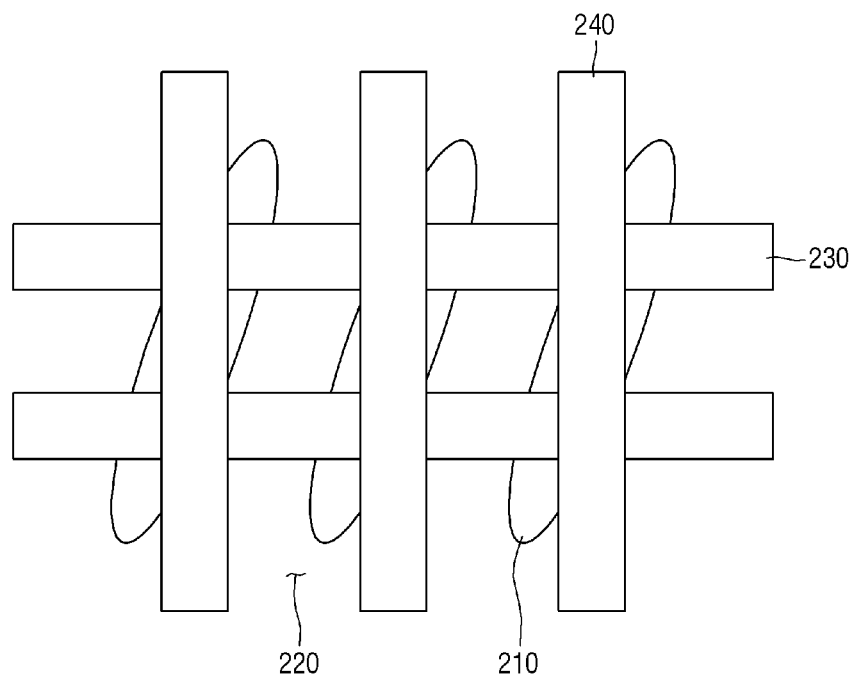
FIG. 7 is a plan view and FIG. 8 and FIG. 9 are cross-sectional views of a semiconductor device during the course of its manufacture and illustrate stages of another example of a method of fabricating a semiconductor according to the inventive concept.
Figure 8:
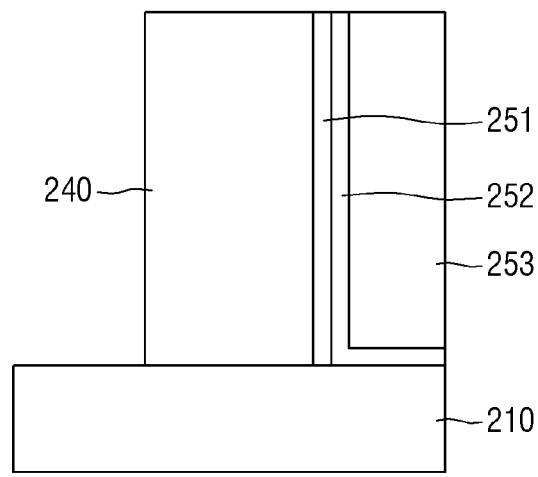
Figure 9:
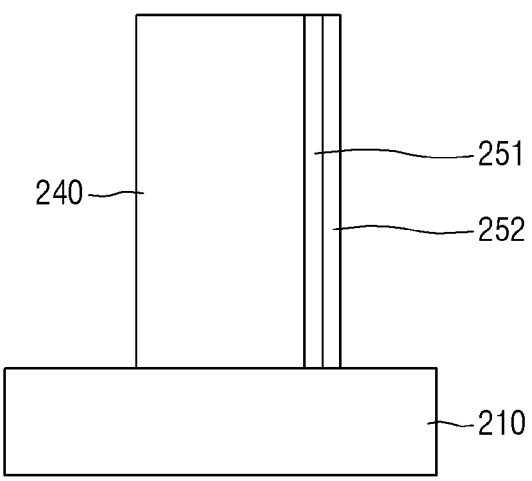

A method of fabricating another example of a semiconductor according to the inventive concept will be described referring to FIG. 7 to FIG. 9. FIG. 7 to FIG. 9 illustrate a method of fabricating a DRAM cell semiconductor device.

FIG. 7 illustrate a layout diagram of the DRAM cell region. Gates 230 pass through active regions 210 of the substrate in a first horizontal direction, and global bit lines (GBL) 240 pass through the active regions 210 in a second horizontal direction which is different from the first horizontal direction, e.g., which is perpendicular to the first horizontal direction. Portions other than the active regions 210 of the substrate are element isolation regions 220.

Referring to FIG. 8 and FIG. 9, the memory cell region is illustrated. The GBL 240 serving as a bit line is formed on the active region 210 of the semiconductor substrate. Subsequently, after forming the GBL 240, a first dielectric film 251 containing silicon oxide is formed on the sidewalls of the GBL 240. In this case, the first dielectric film 251 may perform the function of a spacer.

Next, a second dielectric film 252 comprising silicon nitride is formed on the first dielectric film 251. In this case, the second dielectric film 252 may be formed using the ALD method of the inventive concept described above.

Specifically, when forming the second dielectric film 252, after adjusting the deposition apparatus to provide an appropriate temperature and pressure, a first gas containing a silicon source precursor is supplied into the chamber. Then, the silicon precursor is adsorbed onto the first dielectric film 251. HCDZ is utilized as the silicon source precursor, as described above.

Subsequently, as described above, the first purge gas, the second gas and the second purge gas are sequentially supplied into the deposition chamber, and silicon nitride film of the atomic layer level is formed on the first dielectric film 251. In this case, the reaction between the second gas and the silicon precursor may be performed thermally and by plasma excitation.

By repeating the above procedure, the second dielectric film 252, namely, a film of silicon nitride is formed to the desired thickness on the first dielectric film 251.

Subsequently, a third dielectric film 253 containing silicon oxide is formed on the second dielectric film 252.

Because there is no need for forming an impurity layer in the cell region, a photoresist pattern (not illustrated) covering the cell region is formed. After removing the photoresist pattern (not illustrated) and removing the third dielectric film 253, the second dielectric film 252 is anisotropically etched to form a nitride film spacer, and the second dielectric film 252 adjacent to the active region 210 of the substrate is removed.

A method of fabricating still another example of a semiconductor according to the inventive concept will be described referring to FIG. 10 to FIG. 13. FIG. 10 to FIG. 13 illustrate a method of fabricating a semiconductor device having a laminated nanosheet transistor structure.

Figure 10:
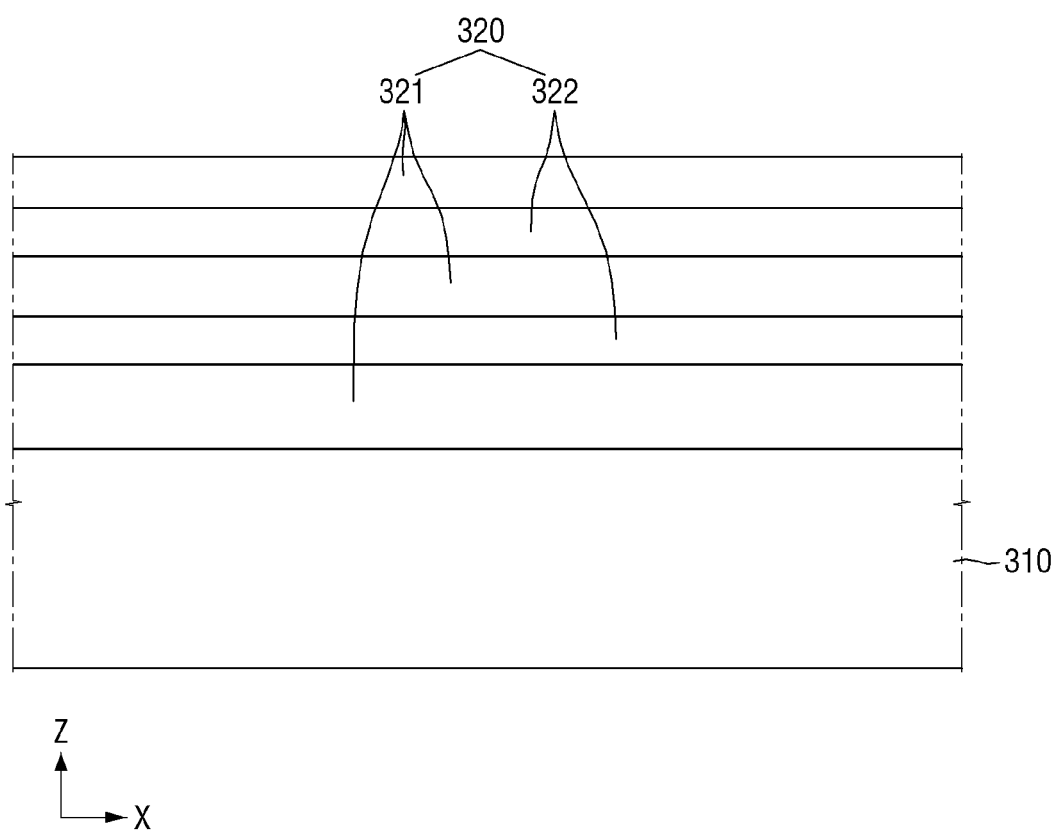
FIG. 10, FIG. 11, FIG. 12 and FIG. 13 are cross-sectional views of a semiconductor device during the course of its manufacture and illustrate stages of still another example of a method of fabricating a semiconductor according to the inventive concept.

Referring to FIG. 10, a laminated (multi-layered) structure 320 in which sacrificial layers 321 and semiconductor layers 322 are alternately disposed is formed over the substrate 310.

Of the multi-layered structure 320, the sacrificial layers 321 adjacent to the substrate 310, for example, may be layers bonded to the substrate 310 via a wafer bonding method or the like, but the inventive concept is not limited thereto.

The semiconductor layers 322 and the sacrificial layers 321 may be alternately formed on the sacrificial layer 321 adjacent to the substrate 310. The sacrificial layers 321 and the semiconductor layers 322 may be formed using an epitaxial growth method, for example, but the inventive concept is not limited thereto. The uppermost layer of the laminated structure 320 may be a sacrificial layer 321, but the inventive concept is not limited thereto.

The sacrificial layers 321 and the semiconductor layers 322 may contain different materials from each other. The sacrificial layers 321 and the semiconductor layers 322 may contain materials having an etching selectivity with respect to each other. The sacrificial layers 321 may contain SiGe or Ge, for example, but the inventive concept is not limited thereto. The semiconductor layers 322 may contain Si or group III-V compound semiconductors, for example, but the inventive concept is not limited thereto.

Subsequently, a first mask pattern (341 in FIG. 11) extending in the first direction X is formed on the laminated structure 320.

The first mask pattern (341 of FIG. 11) may be formed of at least one of a silicon oxide film, a silicon nitride film and a silicon oxynitride film, for example. When the first mask pattern 341 contains a silicon nitride film, the first mask pattern 341 may be formed using an ALD method of the inventive concept.

Specifically, when forming the first mask pattern 341, after adjusting the deposition apparatus to provide an appropriate temperature and pressure in the deposition chamber, a first gas containing a silicon source precursor is supplied into the chamber. Then, the silicon precursor is adsorbed onto the laminated structure 320. HCDZ is utilized as the silicon source precursor, as described above.

Subsequently, as described above, the first purge gas, the second gas and the second purge gas are sequentially supplied into the deposition chamber, and an atomic level layer of silicon nitride is formed on the laminated structure 320.

By repeating the above procedure, the first mask pattern 341 comprising a silicon nitride film of a desired thickness is formed on the laminated structure 320.

Figure 11:
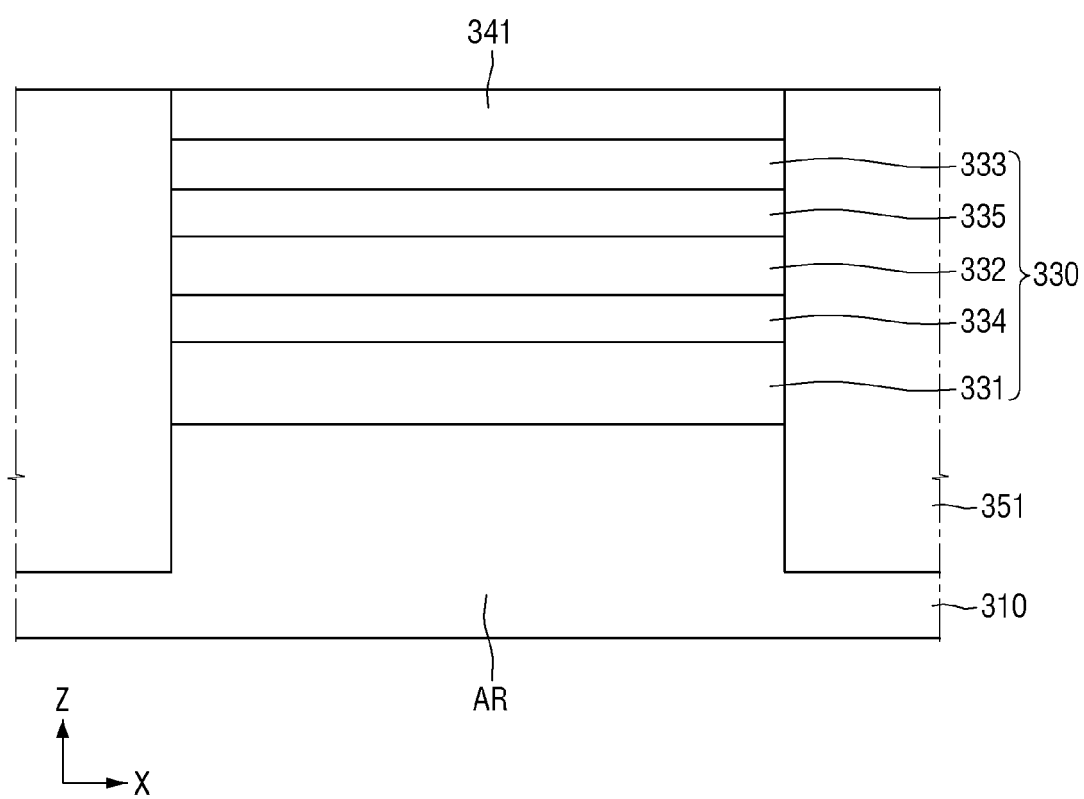

Referring to FIG. 11, a semiconductor pattern structure 330 is formed by etching the laminated structure 320 utilizing the first mask pattern 341 as an etch mask. For example, by etching the laminated structure 320 until the upper surface of the substrate 310 is exposed, the semiconductor pattern structure 330 may be formed.

The semiconductor pattern structure 330 may extend longitudinally in a first (horizontal) direction X. Furthermore, the semiconductor pattern structure 330 may include a plurality of sacrificial layers and a plurality of semiconductor layers which are alternately disposed in a second (vertical) direction Z in the form of a laminate on the substrate 310.

That is, the semiconductor pattern structure 330 may include a first sacrificial layer 331 formed on the substrate 310, a first semiconductor layer 334 formed on the first sacrificial layer 331, a second sacrificial layer 332 formed on the first semiconductor layer 334, a second semiconductor layer 335 formed on the second sacrificial layer 332, and a third sacrificial layer 333 formed on the second semiconductor layer 335.

Furthermore, when etching the laminated structure 330, the substrate 310 may be partially etched to form an active region AR. Next, an interlayer insulating film may be formed to cover the substrate 310 and the first mask pattern 341. The resulting structure may be planarized until the upper surface of the first mask pattern 341 is exposed. As a result, the interlayer insulating film 351 can be formed.

Subsequently, the first mask pattern 341 located on the semiconductor pattern structure 330 may be removed.

Figure 12:
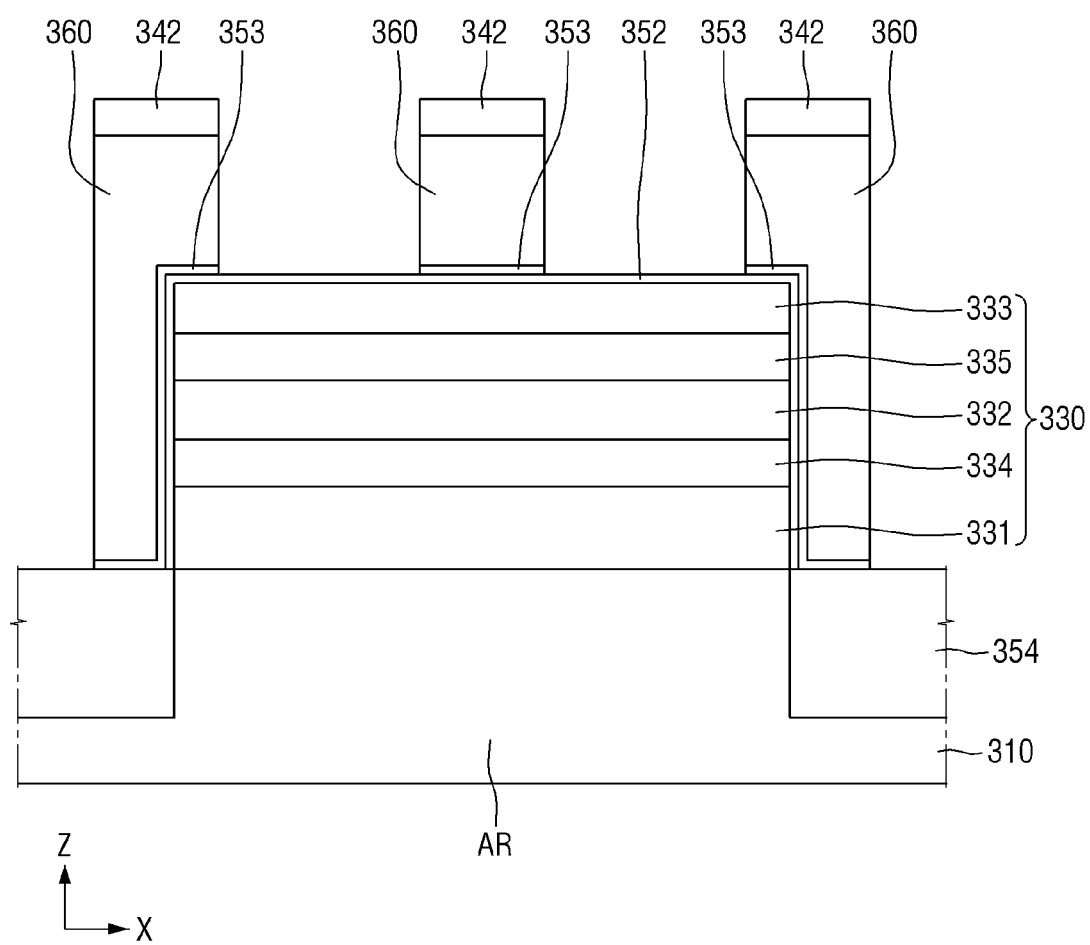

Referring to FIG. 12, by performing an etching process using the second mask pattern 342 as an etch mask, a gate insulating film 353 and a sacrificial gate 360 which intersect with the semiconductor pattern structure 330 and extend in a third (horizontal) direction perpendicular to the first direction X and the second direction Z may be formed.

The second mask pattern 342 may be formed of at least one of a silicon oxide film, a silicon nitride film and a silicon oxynitride film, for example. When the second mask pattern 342 contains the silicon nitride film, the second mask pattern 342 may be formed using the ALD method of the inventive concept.

Thus, the sacrificial gate 360 may be formed on the semiconductor pattern structure 330. Furthermore, the gate insulating film 353 may be formed along the sidewall and the upper surface of the insulating film 352 and the upper surface of the field insulating film 354, respectively.

Here, the insulating film 352 may be formed to cover the semiconductor pattern structure 330, and the insulating film 352 may be formed so that it is interposed between the semiconductor pattern structure 330 and the gate insulating film 353. Here, the insulating film 352 may be an oxide film, for example, and more specifically, may contain $SiO_2$, but the inventive concept is not limited thereto.

The gate insulating film 353 may be a silicon oxide film, and the sacrificial gate 360 may be polysilicon or amorphous silicon, but the inventive concept is not limited thereto.

Figure 13:
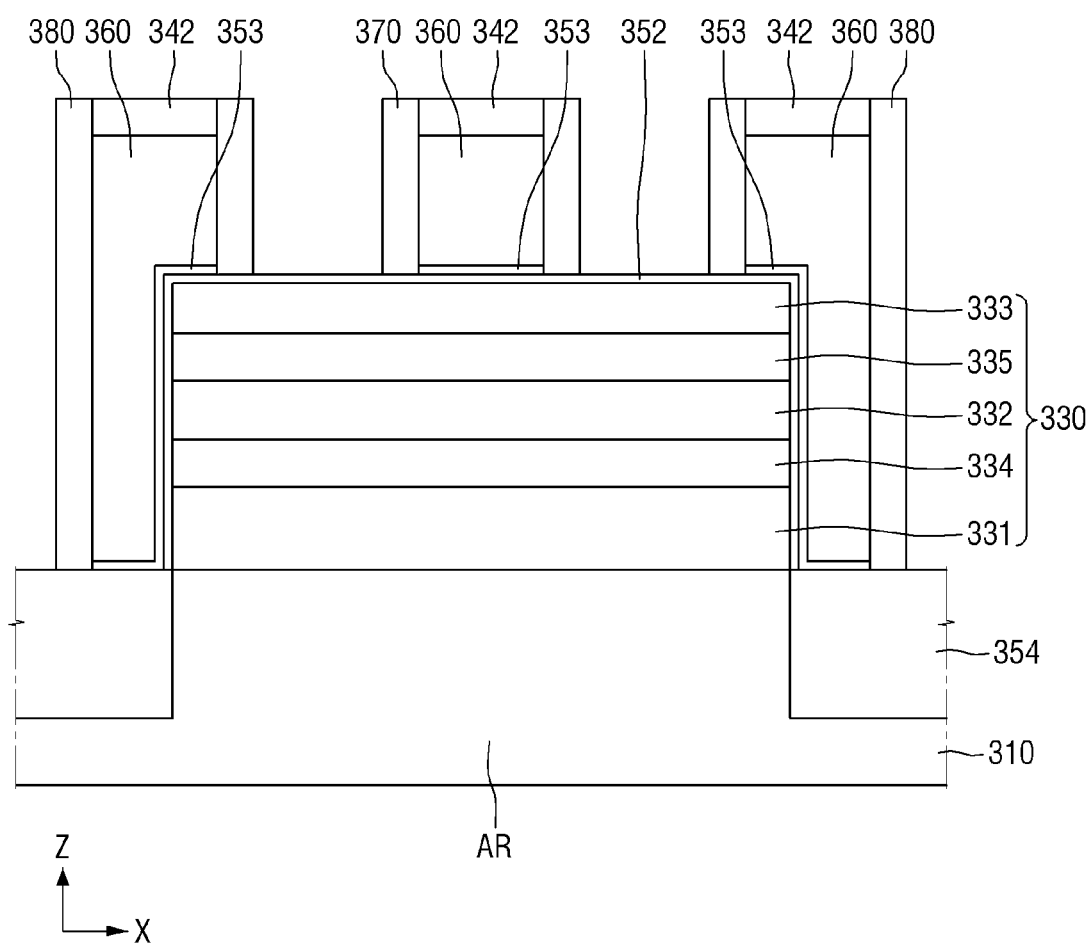

Referring to FIG. 13, a gate spacer 370 and a dummy gate spacer 380 are formed on the sidewalls of the sacrificial gate 360.

Specifically, a spacer film that covers the sacrificial gate 360 and the semiconductor pattern structure 330 is formed on the substrate 310. When the spacer film contains silicon nitride, the spacer film may be formed using the ALD method of the inventive concept.

Specifically, when forming the spacer film, after adjusting the ALD apparatus to provide an appropriate temperature and pressure in the deposition chamber, a first gas containing a silicon source precursor is supplied into the chamber. Then, the silicon precursor is adsorbed onto the sacrificial gate 360 and the semiconductor pattern structure 330. Here, HCDZ is utilized as the silicon source precursor, as described above.

Subsequently, as described above, the first purge gas, the second gas and the second purge gas are sequentially supplied into the deposition chamber, and an atomic level layer of silicon nitride is formed on the sacrificial gate 360 and the semiconductor pattern structure 330.

By repeating the above procedure, the spacer film of silicon nitride film is formed to a desired thickness on the sacrificial gate 360 and the semiconductor pattern structure 330.

Next, by performing an etch-back of the spacer film, a gate spacer 370 and a dummy gate spacer 380 may be formed on the sidewalls of the sacrificial gate 360.

Figure 14:
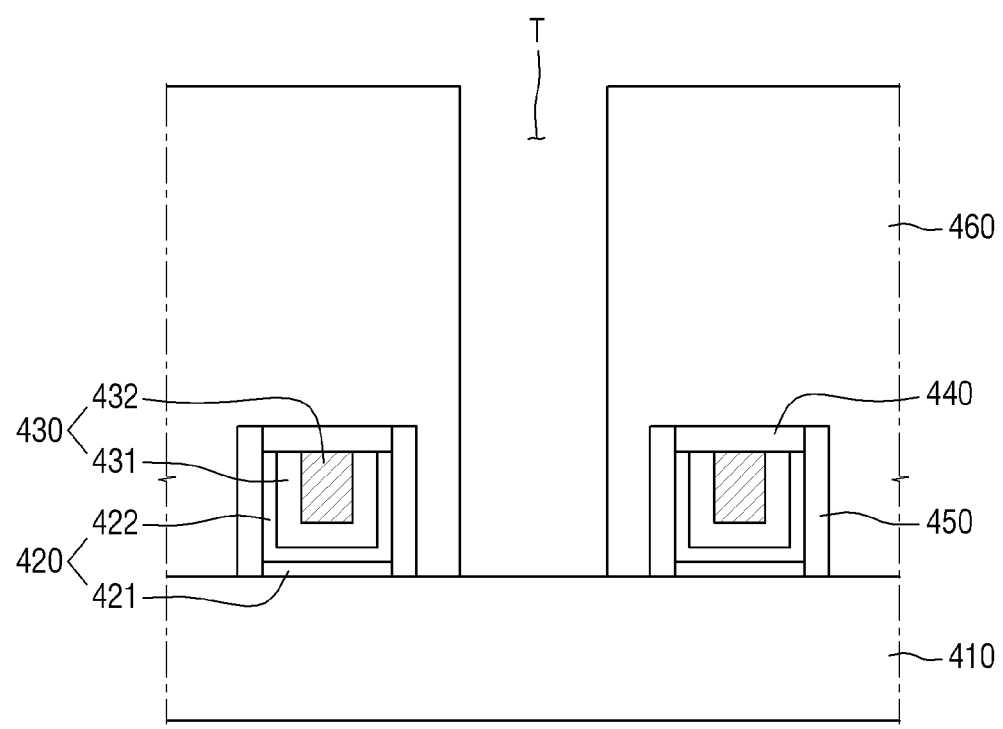
FIG. 14 and FIG. 15 are cross-sectional views of a semiconductor device during the course of its manufacture and illustrate stages of still another example of a method of fabricating a semiconductor according to the inventive concept.
Figure 15:
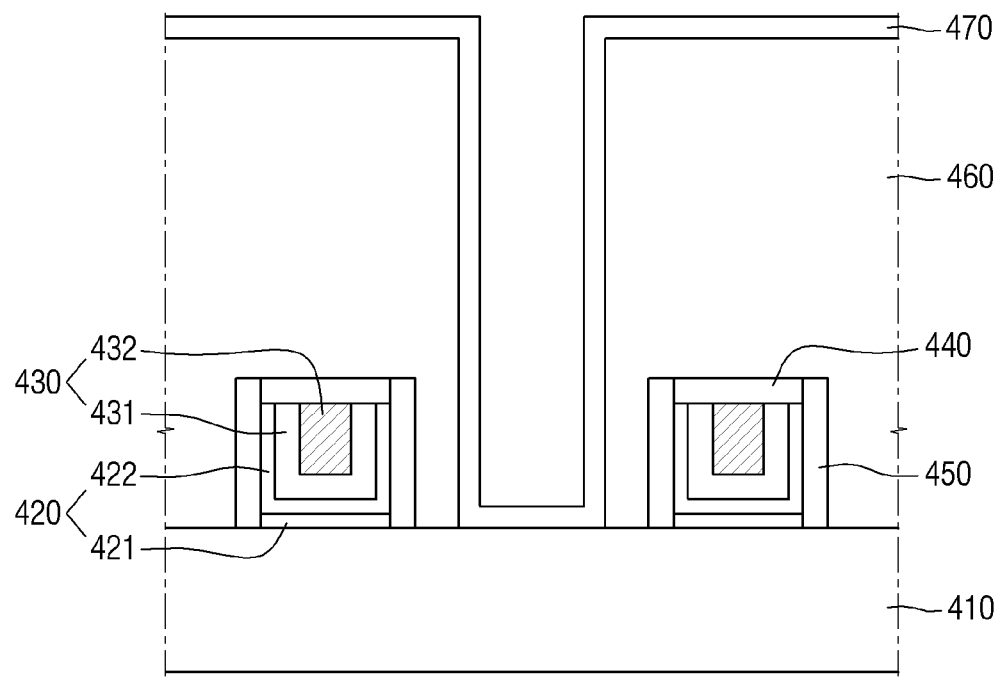

A method of fabricating still another example a semiconductor according to the inventive concept will be described referring to FIG. 14 and FIG. 15. FIG. 14 and FIG. 15 illustrate a method a fabricating a semiconductor device in which a liner is formed for a contact of the device.

Referring to FIG. 14, a first gate pattern and a second gate pattern may be formed on a substrate 410 to be spaced apart from each other. Here, the first gate pattern and the second gate pattern have substantially the same configuration.

Each of the first and second gate patterns may include a gate spacer 450, an insulating film pattern 420, a gate electrode pattern 430 and a capping pattern 440.

The insulating film pattern 420 may include an interface film 421, and a gate insulating film 422.

The interface film 421 may serve to prevent a defective interface between the substrate 410 and the gate insulating film 422.

The interface film 421 may include a low-k dielectric material layer having a dielectric constant (k) of 9 or less, e.g., a silicon oxide film (k is about 4) or a silicon oxynitride film (k is about 4 to 8 depending on the content of oxygen and nitrogen in the film).

The interface film 421 may be formed by utilizing a chemical oxidation method, e.g., an ultraviolet oxidation (UV oxidation) method, a dual plasma oxidation method or the like.

The gate insulating film 422 may be formed on the interface film 421. However, the interface film 421 is optional, in which case the gate insulating film 422 is formed directly on the substrate 410.

The gate insulating film 422 may include a material having a high dielectric constant (high-k). The gate insulating film 422 may thus include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate, but the inventive concept is not limited thereto.

Moreover, the gate insulating film 422 may be formed to a particular thickness depending on the type of elements to be formed. For example, when the gate insulating film 422 is $HfO_2$, the gate insulating film 422 may be formed to a thickness of about 50 Å or less (about 5 Å to 50 Å), but inventive concept not limited thereto.

The gate electrode pattern 430 may include a work function adjustment film 431 and a gate metal 432.

The work function adjustment film 431 may be formed on the gate insulating film 422. The work function adjustment film 431 may be formed in contact with the gate insulating film 422. The work function adjustment film 431 is used to adjust the work function.

The work function adjustment film 431 may contain a metal nitride, for example. Also, the work function adjustment film 431 may contain other materials depending on the type of semiconductor device being manufactured. For example, a p-type work function adjustment film may include at least one of TiN, WN, TaN, and Ru, but the inventive concept is not limited thereto. Furthermore, an n-type work function adjustment film may include at least one of Ti, Ag, Al, TiAl, TiAlN, TiAlC, TaC, TaCN, TaSiN, Mn, and Zr, but the inventive concept is not limited thereto.

Further, the p-type work function adjustment film may be a single film of TiN or a double film made of a TiN lower film and a TaN upper film, but the inventive concept is not limited thereto.

The gate metal 432 may be formed on the work function adjustment film 431. As illustrated, the gate metal 432 may be formed in contact with the work function adjustment film 431. That is, the gate metal 432 may be formed to fill a space within the work function adjustment film 431. The gate metal 432 may include an electrically conductive material, e.g., W or Al, but the inventive concept is not limited thereto.

A capping pattern 440 may be formed on the gate metal 432. As illustrated, the capping pattern 440 may be formed in contact with the gate metal 432. The capping pattern 440 may include at least one of silicon nitride (SiN), silicon oxynitride (SiON), silicon oxide (SiO$_2$), silicon carbonitride (SiCN), and silicon carbide oxynitride (SiOCN).

An interlayer insulating film 460 is formed on the substrate 410 and may be formed to cover the first gate pattern and the second gate pattern. The interlayer insulating film 460 may include at least one of a low dielectric constant material, an oxide film, a nitride film and an oxynitride film. Examples of the low dielectric constant include FOX (Flowable Oxide), TOSZ (Tonen SilaZen), USG (Undoped Silica Glass), BSG (Borosilica Glass), PSG (PhosphoSilaca Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material and combinations thereof, but the inventive concept is not limited thereto.

After the first and second gate patterns are formed on the substrate 410, an interlayer insulating film 460 covering the first and second gate patterns is formed.

Next, a trench T is formed in the interlayer insulating film 460 to expose the substrate 410 between the first gate pattern and the second gate pattern. The trench T may be formed in the interlayer insulating film 460 by removing part of the interlayer insulating film 460 using a dry etching process, a wet etching process or a combination of dry and wet etching processes.

Referring to FIG. 15, spacer material 470 is conformally formed on the sides of the trench T. When the spacer material 470 includes a silicon nitride film, the spacer material 470 may be formed using the ALD method of the inventive concept.

Specifically, when forming the spacer material 470 on the sides of the trench T, after adjusting the ALD apparatus to provide an appropriate temperature and pressure in the deposition chamber, a first gas containing a silicon source precursor is supplied into the chamber. Then, the silicon precursor is adsorbed onto surface defining the trench T. Here, HCDZ is utilized as the silicon source precursor, as described above.

Subsequently, as described above, the first purge gas, the second gas and the second purge gas are sequentially supplied into the chamber, and an atomic level layer of silicon nitride is conformally formed along sides and the bottom of the trench T.

By repeating the above procedure, a contact spacer made of a silicon nitride film of a desired thickness is formed in the trench T.

Figure 16:
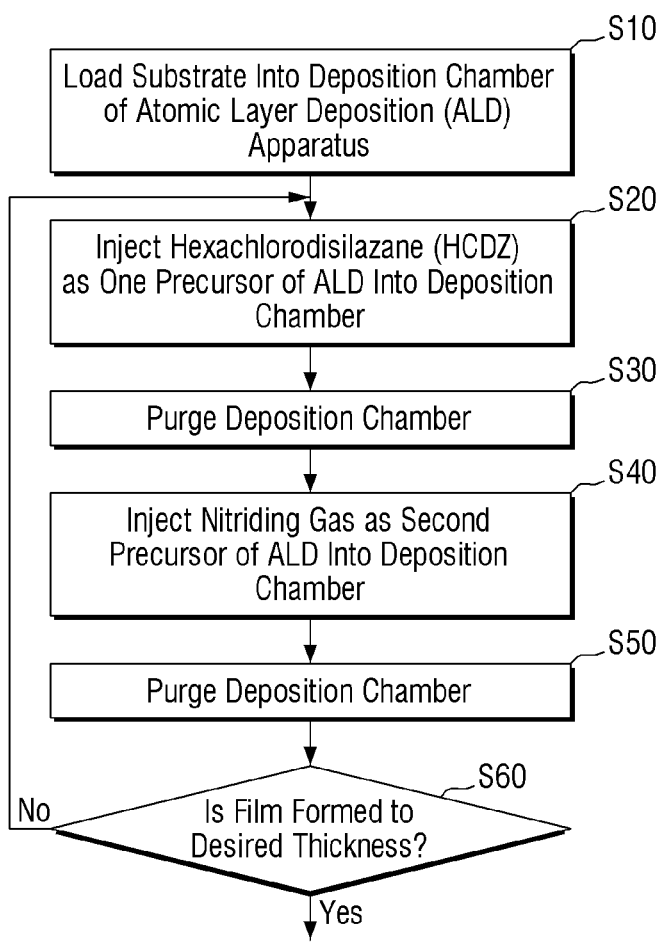
FIG. 16 is a flow chart of a method of fabricating a semiconductor device according to the inventive concept.

FIG. 16 illustrates examples of a method of fabricating a semiconductor device according to the inventive concept. Part of the method illustrated by FIG. 16 (an ALD process) may be the same as that shown in and described with reference to FIG. 1.

First, on object on which a dielectric film is to be formed by atomic layer deposition (ALD) is loaded into a reaction chamber of deposition apparatus (S10). Thus, the deposition apparatus may be considered as an ALD apparatus. The object may be a substrate on which some structure has been formed. The structure may define an opening therein such as a trench. In the case of a trench, the structure thus has a "step" in which a tread of the step defines the bottom of the opening and the riser of the step defines the side of the opening. In any case, the opening may have an aspect ratio of at least 10, e.g., a ratio of the height to width of the bottom of the opening of 10:1 or more. However, the object need not define an opening and may have any surface or surfaces to be coated with a dielectric film comprising a nitride of silicon.

The ALD apparatus may be controlled to regulate the process conditions such as temperature and pressure in the deposition chamber.

Next, gas containing a first precursor of an ALD process is injected into the deposition chamber (S20). The precursor is silicon and the gas is HCDZ (hexachlorodisilazane) in this example. Accordingly, the gas does not contain an significant amount of carbon or nitrogen in this example.

Then the deposition chamber is purged (S30) of gas including any of the HCDZ that has not reacted with the surface(s) of the object, i.e., which has not been adsorbed by the surface(s) on which the dielectric film is to be formed. To this end, a first purge (inert) gas may be introduced into the deposition chamber.

Next, a nitriding gas that reacts with HCDZ is injected into the deposition chamber (S40). As a result, an atomic level of a nitride layer that includes silicon is formed at the surface(s) of the object, which is followed by another purge (S50) of the deposition chamber. The purge (S50) may be accomplished by injecting a purge gas into the deposition chamber and this purge gas may be the same as that used during the first purge (S30).

The above-describes steps S20, S30 S40 and S50 may together constitute one cycle of an ALD process. Thus, a determination is made (S60) as to whether the resulting dielectric film, e.g., a silicon nitride film, has been formed to a desired thickness. If not, another cycle of the ALD process is performed. If so, then the object may be removed from the deposition chamber and/or other layers may be formed on the dielectric film.

By forming a dielectric film through an ALD method using HCDZ as a silicon precursor of the film, according to the inventive concept, good step coverage may be achieved. Thus, it is possible to conformally form a silicon nitride film without voids on a structure defining a step or an opening, e.g., a trench or the like, having a large aspect ratio.

Furthermore, as has been shown experimentally, the WER is relatively improved and thus, it is possible to form a dielectric film of a relatively small thickness of substantially the same quality as existing dielectric films of the same material but formed using a different silicon precursor. Consequentially, the process time is minimized and hence, it is possible to improve the efficiency of the overall manufacturing process.

Although the inventive concept has been particularly illustrated and described with reference to examples thereof, the examples should be considered in a descriptive sense only and not in a limiting sense. That is, it will be understood by those of ordinary skill in the art that various changes in form and detail may be made to the disclosed examples without departing from the spirit and scope of the inventive concept as defined by the following claims.

What is claimed is:

1. A method of forming a dielectric film, the method comprising:
   providing a substrate in a chamber; and
   forming a silicon nitride film on the substrate by atomic layer deposition (ALD),
   wherein the forming of the silicon nitride film by ALD comprises introducing a first gas comprising hexachlorodisilazane (HCDZ) as a silicon precursor into the chamber and introducing a second gas containing nitrogen into the chamber.

2. The method of claim 1, wherein the forming of the silicon nitride film by ALD further comprises:
introducing a first purge gas into the chamber to remove non-reacted first gas, and
introducing a second purge gas into the chamber to remove non-reacted second gas.

3. The method of claim 1, further comprising forming a gate on the substrate, and
wherein the silicon nitride film is formed on side surfaces of the gate.

4. The method of claim 1, wherein the silicon nitride film has a wet etch rate (WER) less than 4.5 nm/min at 500° C.

5. The method of claim 1, wherein the second gas comprises at least one of nitrogen ($N_2$) and ammonia ($NH_3$).

6. A method of fabricating a semiconductor device, the method comprising:
providing in a deposition chamber a substrate having formed thereon a structure defining a step; and
forming a dielectric film structure comprising a first dielectric film of silicon nitride in-situ on the step by atomic layer deposition (ALD),
wherein the forming of the first dielectric film of silicon nitride includes introducing hexachlorodisilazane (HCDZ) as a silicon precursor into the deposition chamber.

7. The method of claim 6, wherein the forming of the first dielectric film of silicon nitride further includes:
after the HCDZ has been introduced into the deposition chamber, introducing a first purge gas into the chamber to remove from the chamber first gas that has not reacted with the structure defining the step,
introducing a second gas containing nitrogen into the chamber, and
introducing a second purge gas into the chamber to remove second gas that has not reacted with the first gas at surfaces of the structure defining the step.

8. The method of claim 6, wherein the forming of the dielectric film structure further comprises:
forming a dielectric film of silicon oxide on the substrate before the first dielectric film is formed such that a second dielectric film of silicon oxide is interposed between the substrate and the first dielectric film.

9. The method of claim 8, wherein the forming of the dielectric film structure further comprises:
forming a global bit line (GBL) on the substrate, and
forming the dielectric film of silicon oxide on the GBL.

10. The method of claim 8, wherein the forming of the dielectric film structure further comprises:
forming a charge storage film on the substrate, and
forming the dielectric film of silicon oxide on the charge storage film.

11. The method of claim 6, further comprising:
forming first and second gate patterns on the substrate;
forming an insulating film that envelops the first and second gate patterns; and
forming a trench in the insulating film between the first and second gate patterns, and
wherein the first dielectric film is formed in the trench on surfaces of the insulating film defining sides of the trench.

12. The method of claim 6, wherein the structure is etched using the first dielectric film as a mask.

13. The method of claim 6, wherein the first dielectric film has a wet etch rate (WER) less than 4.5 nm/min at 500° C.

14. The method of claim 6, wherein a ratio of height to width of the step of the structure is equal to or greater than 10.

15. The method of claim 6, wherein the introducing of hexachlorodisilazane (HCDZ) as a silicon precursor into the deposition chamber is carried out in several discrete cycles from one another, the cycles being carried out to increase the thickness of the first dielectric film.

16. A method of manufacturing a semiconductor device, comprising:
supporting a structure in a deposition chamber of an atomic layer deposition apparatus; and
performing a plurality of cycles of an atomic layer deposition (ALD) process, each of the cycles including:
introducing into the deposition chamber first gas comprising hexachlorodisilazane (HCDZ) as a silicon precursor of a dielectric film, wherein at least some of the HCDZ is adsorbed at a surface of the structure, and
introducing into the deposition chamber a nitriding gas comprising nitrogen as a nitrogen precursor of the dielectric film, wherein at least some of the nitriding gas reacts with the HCDZ adsorbed at the surface of the structure to form an atomic level layer of a nitride on said surface,
whereby a dielectric film comprising a nitride of a desired thickness is formed on said surface.

17. The method of claim 16, wherein the nitride is silicon nitride and the dielectric film of silicon nitride has a wet etching rate (WER) of less than 4.5 nm/min at 500° C. in a solution of hydrofluoric acid (HF) and DI water.

18. The method of claim 17, wherein the ratio by volume of DI to hydrofluoric acid (HF) in the solution is 200:1.

19. The method of claim 16, wherein the nitriding gas comprises at least one of nitrogen ($N_2$), ammonia ($NH_3$) and nitrogen monoxide (NO).

20. The method of claim 16, wherein the structure has surfaces defining a step on or an opening in the structure having an aspect ratio of at least 10, and
the dielectric film is formed along said surfaces.

* * * * *